United States Patent
Kim

(10) Patent No.: US 7,472,331 B2
(45) Date of Patent: Dec. 30, 2008

(54) MEMORY SYSTEMS INCLUDING DEFECTIVE BLOCK MANAGEMENT AND RELATED METHODS

(75) Inventor: Ho-Jung Kim, Gyeonggi-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 652 days.

(21) Appl. No.: 10/969,481

(22) Filed: Oct. 20, 2004

(65) Prior Publication Data

US 2006/0013048 A1 Jan. 19, 2006

(30) Foreign Application Priority Data

Jul. 16, 2004 (KR) .................. 10-2004-0055639

(51) Int. Cl.
G11C 29/00 (2006.01)
(52) U.S. Cl. ...................................... 714/763; 714/710
(58) Field of Classification Search ................ 365/200, 365/185.22; 711/103; 714/7, 710, 763
See application file for complete search history.

(56) References Cited

U.S. PATENT DOCUMENTS

| | | | | | |
|---|---|---|---|---|---|
| 5,963,488 | A | * | 10/1999 | Inoue | 365/200 |
| 6,000,006 | A | * | 12/1999 | Bruce et al. | 711/103 |
| 6,040,999 | A | * | 3/2000 | Hotta et al. | 365/200 |
| 6,237,110 | B1 | * | 5/2001 | Lin et al. | 714/7 |
| 6,601,132 | B2 | | 7/2003 | Nomura et al. | |
| 6,678,785 | B2 | | 1/2004 | Lasser | |
| 7,151,694 | B2 | * | 12/2006 | Meihong et al. | 365/185.22 |
| 2002/0048202 | A1 | | 4/2002 | Higuchi | |
| 2004/0085849 | A1 | | 5/2004 | Myoung et al. | |
| 2004/0196707 | A1 | | 10/2004 | Yoon et al. | |

FOREIGN PATENT DOCUMENTS

| | | |
|---|---|---|
| JP | 11-134257 | 5/1999 |
| JP | 2001-154860 | 6/2001 |
| JP | 2002-108720 | 4/2002 |
| JP | 2002-133892 | 5/2002 |
| JP | 2003-223360 | 8/2003 |
| JP | 2004-103162 | 4/2004 |
| KR | 1020040042478 A | 5/2004 |
| KR | 1020040087245 A | 10/2004 |

* cited by examiner

*Primary Examiner*—David Ton
(74) *Attorney, Agent, or Firm*—Myers Bigel Sibley & Sajovec

(57) ABSTRACT

A memory system may include a plurality of non-volatile memory cells and a memory controller coupled to the plurality of non-volatile memory cells. The plurality of non-volatile memory cells may be arranged in blocks with each block including a plurality of pages of non-volatile memory cells. Moreover, the plurality of non-volatile memory cells may include a plurality of data blocks of non-volatile memory cells, a plurality of reserved blocks of non-volatile memory cells, and at least one management block of non-volatile memory cells. The memory controller may be configured to receive a data address for a page of non-volatile memory cells of a data block during a memory access operation, and to determine if the page of non-volatile memory cells corresponding to the data address is identified as being defective in the at least one management block. If the page of non-volatile memory cells corresponding to the data address is identified as being defective in the at least one management block, the memory controller may be further configured to direct the memory access operation to a page of a reserved block of non-volatile memory cells. Related methods are also discussed.

29 Claims, 7 Drawing Sheets

Fig. 4

| Page | RM | CM | HADDR | | FADDR | |
|---|---|---|---|---|---|---|
| | | | | Page1 → Page32 | | Page1 → Page32 |
| 1 | 0 | 1 | D_Block A | 11000····00 | R_Block 1 | 00111····11 |
| 2 | 0 | 0 | D_Block B | 10101····11 | R_Block 2 | 01010····00 |
| 3 | 1 | 1 | 111····1 | 11111····11 | 11111 | 11111····11 |
| ... | | | | | | |
| 24 | 1 | 1 | 111····1 | 11111····11 | 11111 | 11111····11 |
| ... | | | | | | |
| 32 | 1 | 1 | 111····1 | 11111····11 | 11111 | 11111····11 |

121

US 7,472,331 B2

MEMORY SYSTEMS INCLUDING DEFECTIVE BLOCK MANAGEMENT AND RELATED METHODS

RELATED APPLICATIONS

This application claims the benefit of and priority to Korean Patent Application No. 2004-55639, filed on Jul. 16, 2004, the disclosure of which is hereby incorporated herein by reference in its entirety.

FIELD OF THE INVENTION

This disclosure relates generally to electronics and, more particularly, to electronic memory systems and methods.

BACKGROUND

A flash memory device is a non-volatile memory device, which may be referred to as a Flash Electrically Erasable Programmable Read Only Memory (EEPROM or $E^2$PROM). Nonvolatile memories are able to store data, even with power turned off. Memory cell arrays of flash memory devices (e.g., a NAND-type flash memory device) may be divided into a plurality of blocks, and each of the blocks may be constructed with a plurality of pages. In addition, each of the pages may be constructed with a plurality of memory cells sharing one word line. In general, each block may include 16, 32, or 64 pages, and each page may include 512 Bytes or 2048 Bytes of memory cells.

A flash memory cell may be defective as a result of a fabrication defect, or a flash memory cell may become defective during operation. A block including one or more defective memory cells may be referred to as "Bad Block". If a number of bad blocks in a flash memory device exceeds a regulatory standard (e.g, more than 5), the flash memory device may be regarded as being defective.

However, a flash memory device including a number of bad blocks less than the regulatory standard may be capable of operating with the bad block(s). Using a copy-back operation, for example, data stored at any first page is stored at another page different from the first page. In this case, the first page may exist in a bad block and store valid data. The second page may exist in a block without defects.

If a bad block occurs, valid data stored at the bad block may be temporarily stored in a buffer memory (e.g., a DRAM or SRAM) by a page unit, and then written in another block of the defective flash memory. Since this copy-back operation reads data by a page unit and writes the read data again, it may have an undesirably long duration.

SUMMARY

According to embodiments of the present invention, memory systems may include a plurality of non-volatile memory cells arranged in blocks with each block including a plurality of pages of non-volatile memory cells. The plurality of non-volatile memory cells may include a plurality of data blocks of non-volatile memory cells, a plurality of reserved blocks of non-volatile memory cells, and at least one management block of non-volatile memory cells. In addition, a memory controller may be coupled to the plurality of non-volatile memory cells. More particularly, the memory controller may be configured to receive a data address for a page of non-volatile memory cells of a data block during a memory access operation, and to determine if the page of non-volatile memory cells corresponding to the data address is identified as being defective in the at least one management block. The memory controller may be further configured to direct the memory access operation to a page of a reserved block of non-volatile memory cells if the page of non-volatile memory cells corresponding to the data address is identified as being defective in the at least one management block.

The memory controller may be further configured to direct the memory access operation to the page of non-volatile memory cells of the data block corresponding to the data address if the page of non-volatile memory cells corresponding to the data address is not identified as being defective in the at least one management block. The memory controller may also be configured to determine a reserve address identifying the page of the reserved block of non-volatile memory cells. Moreover, directing the memory access operation to the page of the reserved block of non-volatile memory cells may include substituting the reserve address for the data address of the memory access operation.

The memory controller may also be configured to copy information from the at least one management block of non-volatile memory cells to volatile memory. Accordingly, determining if the page of non-volatile memory cells corresponding to the data address is identified as being defective in the at least one management block may include determining if the page of non-volatile memory cells corresponding to the data address is identified as being defective in the information copied to volatile memory.

After determining that the first page of non-volatile memory cells corresponding to the first data address is defective, the memory controller may be further configured to receive a second data address for a second page of non-volatile memory cells of the data block during a second memory access operation. The memory controller may then determine if the second page of non-volatile memory cells corresponding to the second data address is identified as being defective in the at least one management block. The second memory access operation may then be directed to the second page of the data block identified by the data address if the second page of non-volatile memory cells corresponding to the second data address is not identified as being defective in the at least one management block.

More particularly, the memory access operation may be at least one of a read and/or write operation, and the non-volatile memory cells may be flash memory cells. In addition, non-volatile memory cells of a page may share a same word line.

According to additional embodiments of the present invention, methods may be provided for operating memory systems including a plurality of non-volatile memory cells arranged in blocks with each block including a plurality of pages of non-volatile memory cells. The plurality of non-volatile memory cells may include a plurality of data blocks of non-volatile memory cells, a plurality of reserved blocks of non-volatile memory cells, and at least one management block of non-volatile memory cells. More particularly, a data address for a page of non-volatile memory cells of a data block may be received during a memory access operation, and a determination may be made if the page of non-volatile memory cells corresponding to the data address is identified as being defective in the at least one management block. If the page of non-volatile memory cells corresponding to the data address is identified as being defective in the at least one management block, the memory access operation may be directed to a page of a reserved block of non-volatile memory cells.

If the page of non-volatile memory cells corresponding to the data address is not identified as being defective in the at least one management block, the memory access operation may be directed to the page of non-volatile memory cells of the data block corresponding to the data address. A reserve address may be determined identifying the page of the reserved block of non-volatile memory cells, and directing the memory access operation to the page of the reserved block of non-volatile memory cells may include substituting the reserve address for the data address of the memory access operation.

In addition, information may be copied from the at least one management block of non-volatile memory cells to volatile memory. Accordingly, determining if the page of non-volatile memory cells corresponding to the data address is identified as being defective in the at least one management block may include determining if the page of non-volatile memory cells corresponding to the data address is identified as being defective in the information copied to volatile memory.

After determining that the that the first page of non-volatile memory cells corresponding to the first data address is defective, a second data address may be received for a second page of non-volatile memory cells of the data block during a second memory access operation. A determination may be made if the second page of non-volatile memory cells corresponding to the second data address is identified as being defective in the at least one management block. If the second page of non-volatile memory cells corresponding to the second data address is not identified as being defective in the at least one management block, the second memory access operation may be directed to the second page of the data block identified by the data address.

The memory access operation may include at least one of a read and/or a write operation, and the non-volatile memory cells may include flash memory cells. In addition, non-volatile memory cells of a page may share a same word line.

According to still additional embodiments of the present invention, a memory system may include a plurality of non-volatile memory cells arranged in blocks with each block including a plurality of pages of non-volatile memory cells, and a memory controller coupled to the plurality of non-volatile memory cells. More particularly, the plurality of non-volatile memory cells may include a plurality of data blocks of non-volatile memory cells and a plurality of reserved blocks of non-volatile memory cells. Moreover, the memory controller may be configured to receive a first data address for a first page of non-volatile memory cells of a data block during a first memory access operation, and to determine if the first page of non-volatile memory cells corresponding to the first data address is defective. If the first page of non-volatile memory cells corresponding to the first data address is defective, the first memory access operation may be directed to a page of a reserved block of non-volatile memory cells. The memory controller may be further configured to receive a second data address for a second page of non-volatile memory cells of the data block during a second memory access operation, and to determine if the second page of non-volatile memory cells corresponding to the second data address is defective. If the second page of non-volatile memory cells corresponding to the second data address is not defective, the second memory access operation may be directed to the second page of the data block corresponding to the second data address.

The plurality of non-volatile memory cells may also include at least one management block of non-volatile memory cells. Accordingly, determining if the first page of non-volatile memory cells is defective may include determining if the first page of non-volatile memory cells corresponding to the first data address is identified as being defective in the at least one management block. In addition, the memory controller may be configured to copy information from the at least one management block of non-volatile memory cells to volatile memory. Moreover, determining if the first page of non-volatile memory cells corresponding to the first data address is defective may include determining if the first page of non-volatile memory cells corresponding to the first data address is identified as being defective in the information copied to volatile memory.

In addition, the first memory access operation may be directed to the first page of non-volatile memory cells of the data block corresponding to the first data address if the first page of non-volatile memory cells corresponding to the first data address is not defective. The memory controller may also be configured to determine a reserve address identifying the page of the reserved block of non-volatile memory cells, and directing the memory access operation to the page of the reserved block of non-volatile memory cells may include substituting the reserve address for the first data address of the first memory access operation.

The memory access operation may also include at least one of a read and/or write operation, and the non-volatile memory cells may be flash memory cells. In addition, non-volatile memory cells of a page may share a same word line.

According to yet additional embodiments of the present invention, methods may be provided for operating memory systems including a plurality of non-volatile memory cells arranged in blocks with each block including a plurality of pages of non-volatile memory cells. Moreover, the plurality of non-volatile memory cells may include a plurality of data blocks of non-volatile memory cells and a plurality of reserved blocks of non-volatile memory cells. More particularly, a first data address may be received for a first page of non-volatile memory cells of a data block during a first memory access operation, and a determination may be made if the first page of non-volatile memory cells corresponding to the first data address is defective. If the first page of non-volatile memory cells corresponding to the first data address is defective, the first memory access operation may be directed to a page of a reserved block of non-volatile memory cells. A second data address for a second page of non-volatile memory cells of the data block may be received during a second memory access operation, and a determination may be made if the second page of non-volatile memory cells corresponding to the second data address is defective. If the second page of non-volatile memory cells corresponding to the second data address is not defective, the second memory access operation may be directed to the second page of the data block corresponding to the second data address.

The plurality of non-volatile memory cells may also include at least one management block of non-volatile memory cells, and determining if the first page of non-volatile memory cells is defective may include determining if the first page of non-volatile memory cells corresponding to the first data address is identified as being defective in the at least one management block. In addition, information may be copied from the at least one management block of non-volatile memory cells to volatile memory, and determining if the first page of non-volatile memory cells corresponding to the first data address is defective may include determining if the first page of non-volatile memory cells corresponding to the first data address is identified as being defective in the information copied to volatile memory.

The first memory access operation may be directed to the first page of non-volatile memory cells of the data block corresponding to the first data address if the first page of non-volatile memory cells corresponding to the first data address is not defective. A reserve address identifying the page of the reserved block of non-volatile memory cells may be determined, and directing the memory access operation to the page of the reserved block of non-volatile memory cells may include substituting the reserve address for the first data address of the first memory access operation.

More particularly, the memory access operation may include at least one of a read and/or write operation, and the non-volatile memory cells may be flash memory cells. In addition, non-volatile memory cells of a page may share a same word line.

According to embodiments of the present invention, a flash memory system may be able to efficiently managing a defective block(s) by including a defective block management unit in the flash memory system without performing time consuming copy-back operations.

A flash memory system according to more embodiments of the present invention may include a data block; a reserved block; a flash memory unit including a management block; and a bad block management unit for replacing a defective page address of the data block with an address of the reserved block, referring to the management block. The management block may include a first region for storing an address of the data block; a second region for storing defect information with respect to a page of the data block; and a third region for storing an address of a reserved block to be replaced. The second region may store defect information by bit with respect to the respective page included in the data block.

The management block may further include a fourth region and a fifth region. The fourth region may store information determining whether the data block is a bad block or not, and the fifth region may store information determining whether the data block is an erased block or not. The bad block management unit may include a storage device; an address replacement circuit for replacing an address of the data block from a host with an address of the reserved block referring to the storage device; and a control circuit for controlling various operations of the storage device and the address replacement circuit.

A method for managing a bad block of a flash memory system including a data block, a reserved block and a management block according to still more embodiments of the present invention may include: a) reading data stored at the management block; and b) replacing a defective page address of the data block with a page address of the reserved block, referring to data read from the management block. The method may also include updating the management block in the event that a processing bad block occurs.

The management block may include a first region for storing an address of the data block; a second region for storing defect information with respect to the data block; and a third region for storing an address of a reserved block to be replaced. The management block may also include a fourth region and a fifth region. The fourth region may store information determining whether the data block is a bad block or not, and the fifth region may store information determining whether the data block is an erased block or not.

BRIEF DESCRIPTION OF THE DRAWINGS

FIG. 4 is a diagram illustrating management blocks of FIG. 1.

DETAILED DESCRIPTION OF THE PREFERRED EMBODIMENT

Figure 1:
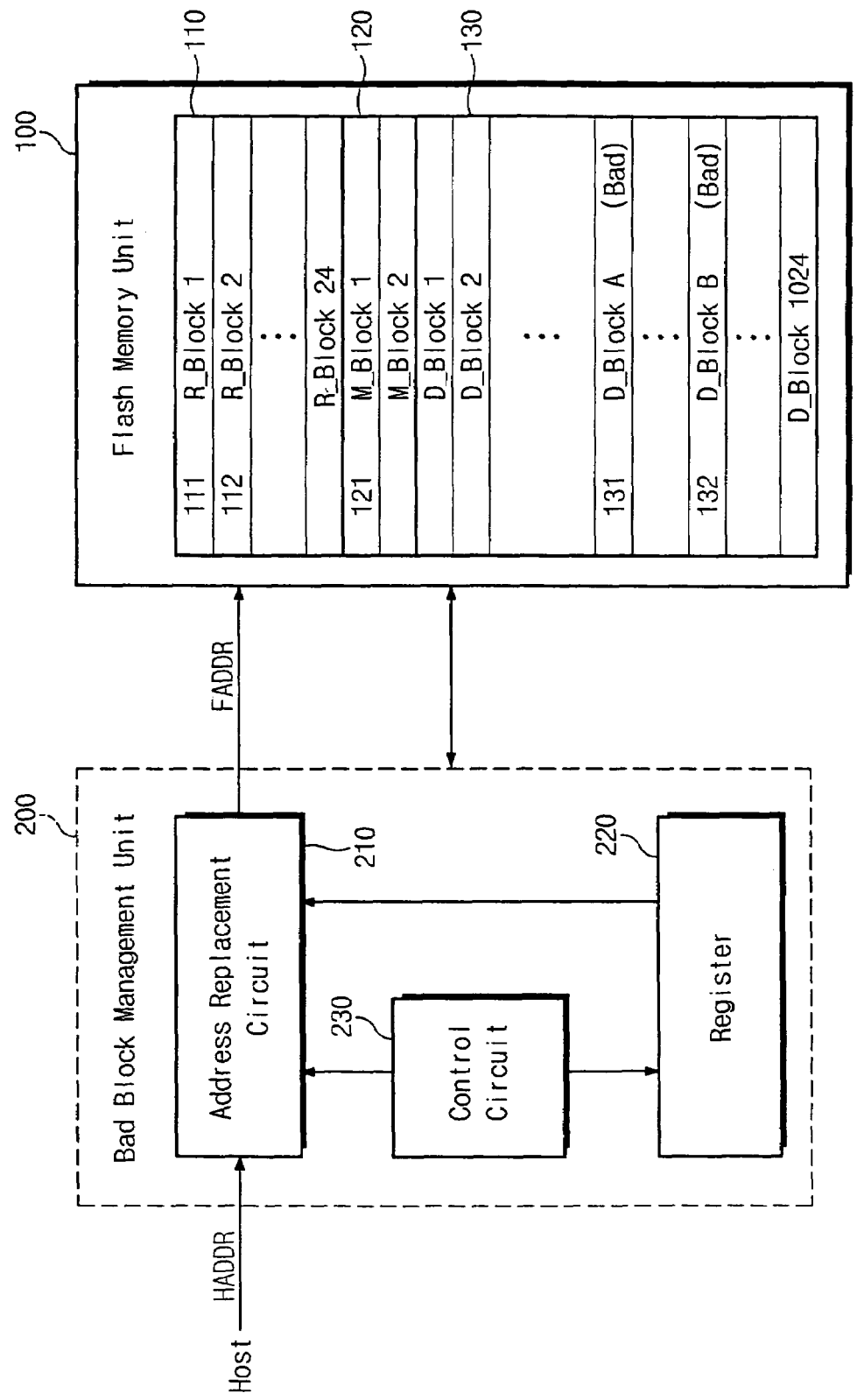
FIG. 1 is a block diagram illustrating semiconductor memory devices according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating semiconductor memory systems according to embodiments of the present invention. The flash memory system of FIG. 1 includes a flash memory unit 100 and a block management unit 200. Referring to FIG. 1, the flash memory unit 100 may include twenty four reserved blocks (R_Block_x; x=1~24) 110, two management blocks (M_Block_y; y=1, 2) 120, and one thousand twenty four data blocks (D_Block_z; z=1~1024) 130.

The reserved blocks 110 may be used to replace respective bad (i.e. defective) blocks from among the data blocks. For example, the data blocks (D_Block_A and D_Block_B) 131 and 132 may be confirmed as bad blocks, and data to be stored in the data blocks 131 and 132 may instead be stored at the reserved blocks (R_Block_1 and R_Block_2) 111 and 112, respectively.

The management blocks 120 may store information for managing a bad block(s). The management block 120 may store address information for a bad block, defect information for each page included in the bad block, address information for a replacement reserved block, etc. For example, addresses with respect to the data blocks 131 and 132, and addresses with respect to reserved blocks 111 and 112 (which are confirmed as bad blocks), may be stored at the management block (M_Block_1) 120. Information for managing a bad block stored at the management blocks will be discussed further with respect to FIG. 4. The bad block management unit 200 may include an address replacement circuit 210, a register 220, and a control circuit 230.

When power is applied to the flash memory system, and the system is booted, bad block management information stored at the management block (e.g., M_Block_1) 121 may be loaded to the register 220. The register 220 may store address replacement data defined by an address mapping table (AMT). The address mapping table may include a Remapping Mark (RM) region, a Complete Mark (CM) region, a region for storing a Host physical ADDRess (HADDR), and a Flash memory ADDRess (FADDR) to be replaced.

While the register 220 is discussed with respect to embodiments of FIG. 1, other storage devices (such as a Random Access Memory RAM) may perform the function of register 220.

The address replacement circuit 210 replaces the HADDR with the FADDR based on an address mapping table stored at the register 220. For example, if an address of a data block confirmed as a bad block from a host is input, the address replacement circuit 210 searches an address of the data block 132 from the address mapping table stored at the register 220. If the address exists, the address replacement circuit 210 replaces the address with an address of pertinent reserved block 112.

The control circuit 230 controls various operations of the register 220 and the address replacement circuit 210 for managing a bad block(s).

Figure 2:
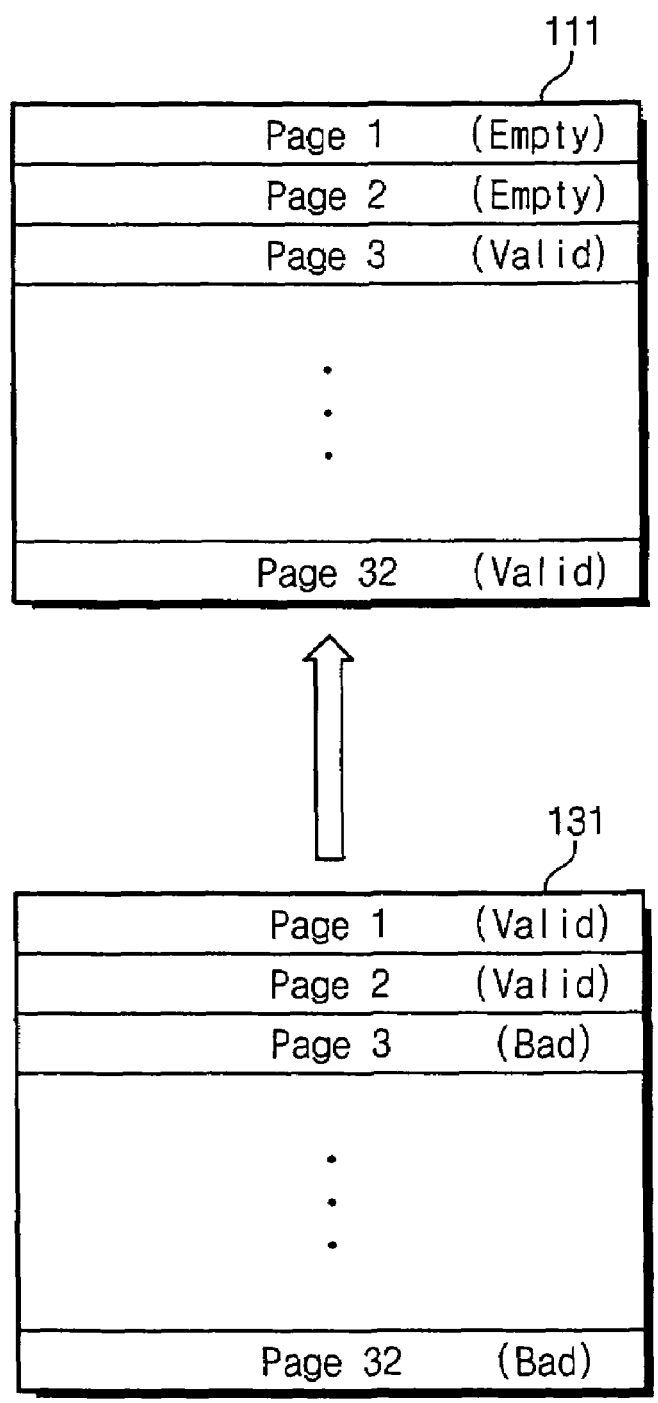
FIGS. 2 and 3 are diagrams illustrating data blocks and reserved blocks of FIG. 1.

FIG. 2 is a diagram illustrating the data block 131 and the reserved block 111 of FIG. 1. Referring to FIG. 2, the data block 131 and the reserved block 111 each include thirty two pages, while first and second pages (Page 1 and Page 2) of the data block 131 have no defects, third through a thirty second pages (Page 3 through Page 32) have defects. Accordingly, the data block 131 is a bad block. Valid data may thus be stored at the first and second pages of the data block 131.

With bad block management using a copy-back operation, after reading data stored at the first and second pages of the data block 131 to a page buffer or an external buffer memory, the read data may be respectively written in the first and second pages of the reserved block 111. In addition, the reserved block 111 is only used without using the data block 131.

In flash memory systems according to embodiments of the present invention, a read operation may be performed using the first and second pages of the data block 131 because the first and second pages of the data block 131 have no defects, However, a read operation and a write operation with respect to the third to thirty second pages (Pages 3-32) of the data block 131 are not performed at the data block 131 and are instead performed at the third to thirty second pages of the reserved block 111. In flash memory systems according to embodiments of the present invention, a bad block may be efficiently managed using an address replacement without performing a time consuming copy-back operation.

Figure 3:
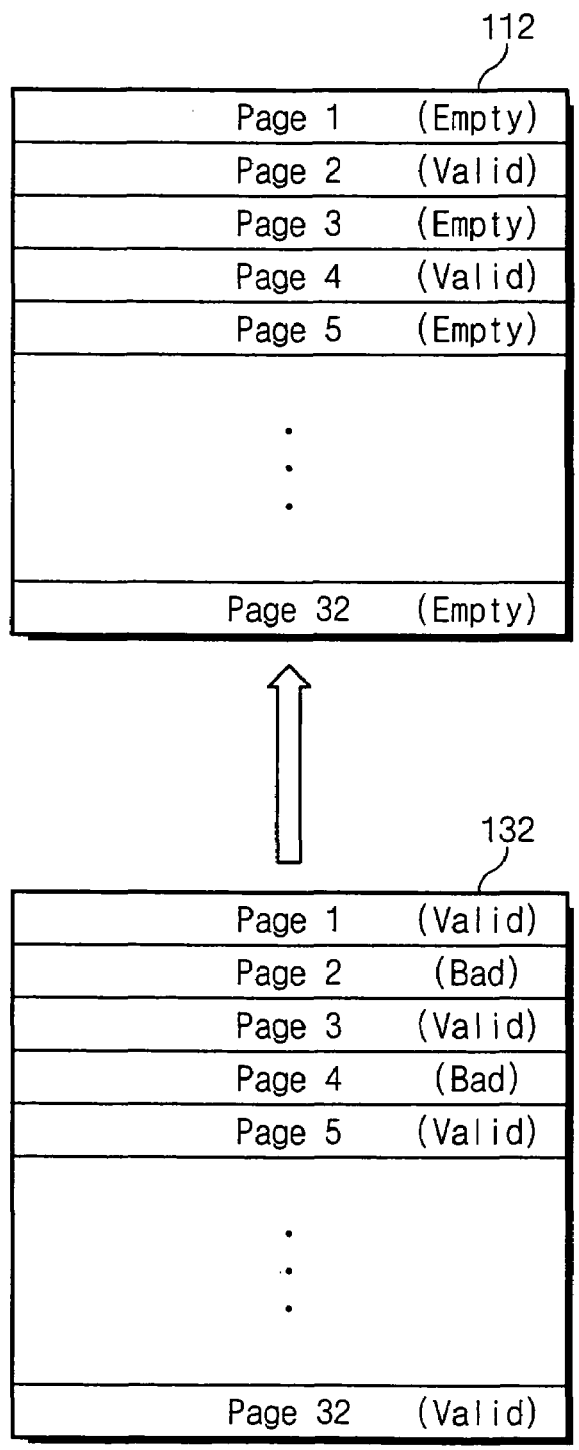

FIG. 3 is diagram illustrating the data block 132 and the reserved block 112 of FIG. 1. The data block 132 is a bad block having defects in the second and fourth pages (i.e. Page 2and Page 4). If a write command, an address, and data with respect to the second page or the fourth page (Page 2or Page 4) are input to a host during a write operation, the data is not written in the defective second or the fourth pages of the data block. Instead, the data is written in the second page or fourth page of the reserved block 112. Similarly, if a read operation with respect to the second page or the fourth page of the data block 132 is performed, the data is read from the second page or the fourth page of the reserved block 112. However, a read or write operation with respect to valid pages (excepting the defective second and fourth pages) of the data block 132 may be performed using the data block 132.

Flash memory systems according to embodiments of the present invention may use a bad block and a reserved block together effectively as a single block. Accordingly, address replacement without performing a copy-back operation may provide a same result as in performing a copy-back operation.

FIG. 4 is a diagram illustrating the management block 121 of FIG. 1. The management block 121 may include thirty two pages. Each of the pages may include a RM (Remapping Mark) region; a CM (Complete Mark) region; a region supplied from a host storing an address of the data block and defect information with respect to a page of the data block; and an address supplied to a flash memory unit and to be replaced. The RM stores information determining whether the data block is a bad block or not, and the CM stores information determining whether the data block is an erased block or not.

For example, a first page of the management block 121 includes the RM region (indicated as "0"), the CM region (indicated as "1"), an address with respect to the data block (D_Block_A) 131, a region for storing defect information with respect to pages included in the data block 131, an address with respect to the reserved block (R_Block_1) 111 (see FIG. 2), and a region for storing page defect information and complementary data of the data block 131 (the third through thirty second pages are indicated as "1"). The RM region indicates if the data block (see FIG. 2) is a bad block, and the CM region indicates if an erase operation has not been performed after the data block 131 is a bad block.

Referring to FIGS. 2 and 4, the case where defects occur from the third page to thirty second page of the data block will be described as follows. Referring to the first page of the management block, the data block 131 is confirmed as a bad block, so that RM=0. In addition, an erase operation with respect to the data block 131 is not performed, so that CM=1. If CM=1, an address replacement is performed considering defect information for pages included in the data block 131. That is, an address replacement of the data block 131 as well as an address replacement of a page included in the data block 131 is performed. D_Block_A denoted in FIG. 4 is an address with respect to the data block 131. Next, information of the respective page is stored. Because the first and second pages of the data block 131 have no defects, they are indicated as data "1", and since the third through thirty second pages have defects, they are dictated as data "0". In addition, an address with respect to the reserved block 111 is stored as R_Block_1 in FIG. 4. Information with respect to each page included in the reserved block is stored. Referring to FIG. 4, defect information with respect to a page included in the data block 131 is the complement of information with respect to a page included in the reserved block 111.

Referring to the second page of the management block 121, a RM region indicating a bad block (indicated as "0") and a CM region indicating that an erase operation has been performed (indicated as "0") are confirmed. The RM region shows that the data block 132 (see FIG. 3) has become a bad block, and a CM region shows that an erase operation has been performed after the data block became a bad block. Additionally, information may be provided that the second and fourth pages among pages included in the data block 132 have defects. Data to be written in the second and fourth pages is written in the second and fourth pages of the reserved block (R_Block_2) 112 (see FIG. 3).

In this case, the CM region updated to "0" means that an address with respect to the data block 132 is unconditionally exchanged to the reserved block 112 irrespective of defect information with respect to a page included in the data block 132. If an erase command is input from the view point of characteristic of a flash memory device performing an erase operation by a block unit, a bad block is not erased, but a reserved block is erased. Next, the CM region is updated to "0", a bad block is not used any more, and only the reserved block is used.

Figure 5:
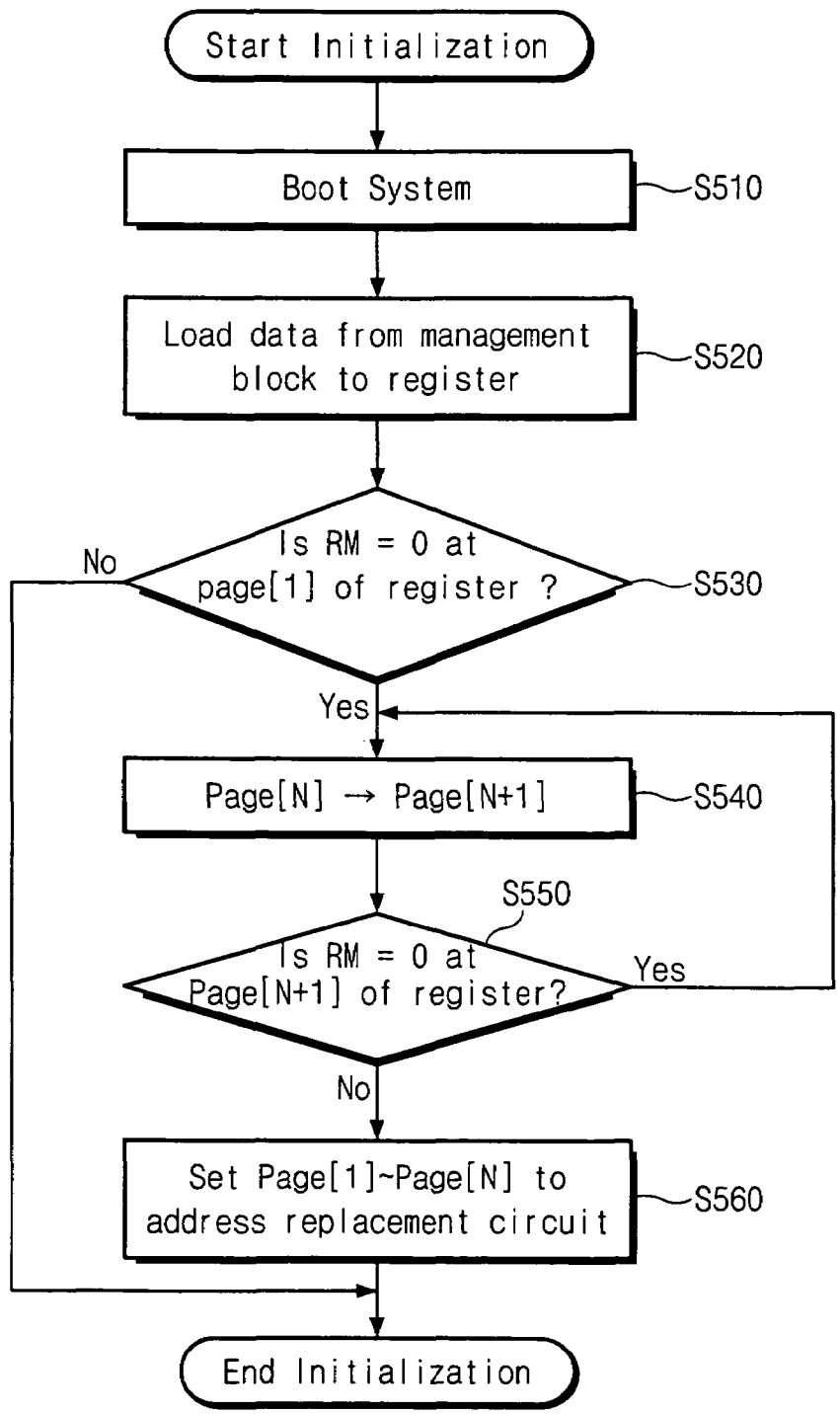
FIG. 5 is a flowchart illustrating initialization operations for managing a bad block according to embodiments of the present invention.

FIG. 5 is a flowchart illustrating initialization operations for managing a bad block. If a system is booted (at block S510), data is loaded from a management block 120 (see FIG. 2) to a register 220 (at block S520). Next, whether data stored at a RM (Remapping Mark) region of a first page Page [1] of the register 220 is "0" or not is checked (at block S530). In case that data in the RM region of the first page is "1", a bad block does not exist. As a result, an initialization may end without setting an address replacement circuit 210 (see FIG. 2). However, if data in the RM region of the first page is "0", whether data in the RM region of a second page is "0" or not is checked (at blocks S540 and S550). In case that the data of the RM region of the second page "0", whether data in the RM region of a third page is "0" or not is checked (S540 and S550). After repeating these processes at blocks S540 and S550, if data of the RM region of a N+1 page (Page [N+1]) is "1", the address replacement circuit 210 is set to perform an address replacement operation using bad block management information stored at the first to N pages (at block S560), and the initialization is then ended. The address replacement circuit 210 then receives an address HADDR from a host to replace an address internally and outputs an address FADDR to the flash memory unit 100.

Figure 6:
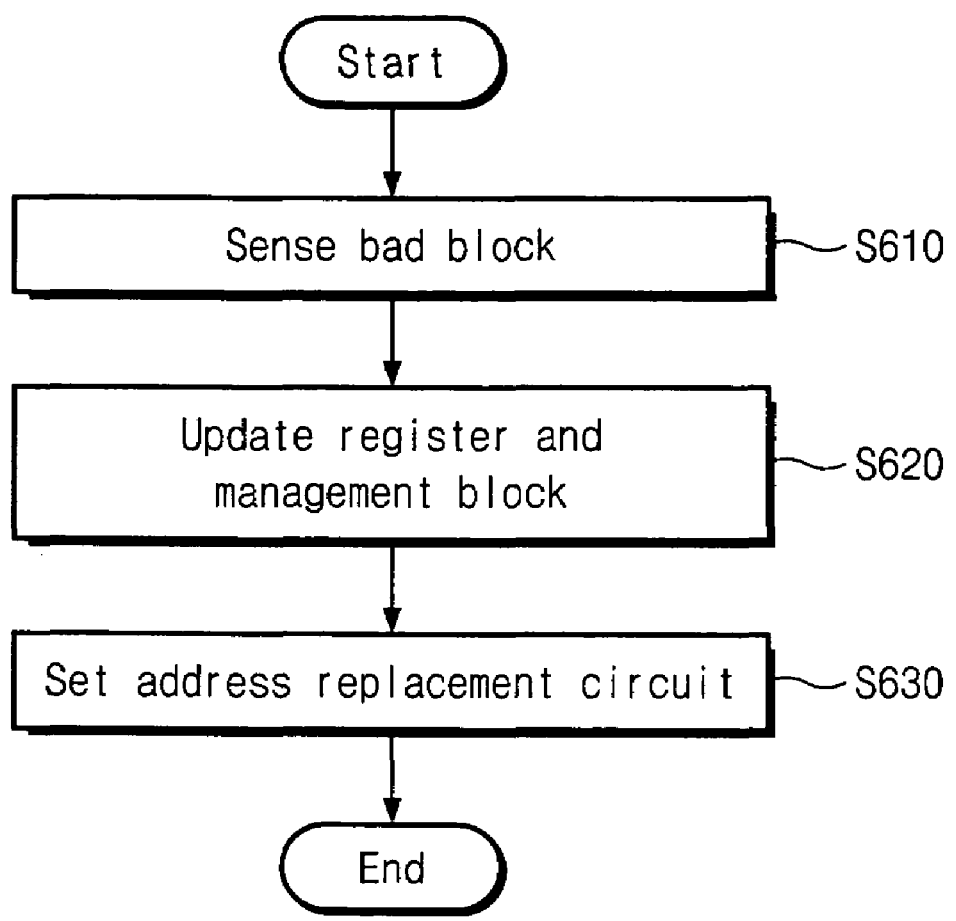
FIG. 6 is a flowchart illustrating operations for setting an address replacement circuit in the event that a block defect occurs during processing according to embodiments of the present invention.

FIG. 6 is a flowchart illustrating operations of setting an address replacement circuit in the event that a bad block occurs during a write operation. This bad block may be defined as a processing bad block. If the processing of a bad block is sensed (at block S610), addresses of the bad block and a reserved block to be replaced may be stored at a next page of the register and the management block (e.g., the third page in FIG. 4) (at block S620). Then, the address replacement circuit may be set (at block S630).

Figure 7:
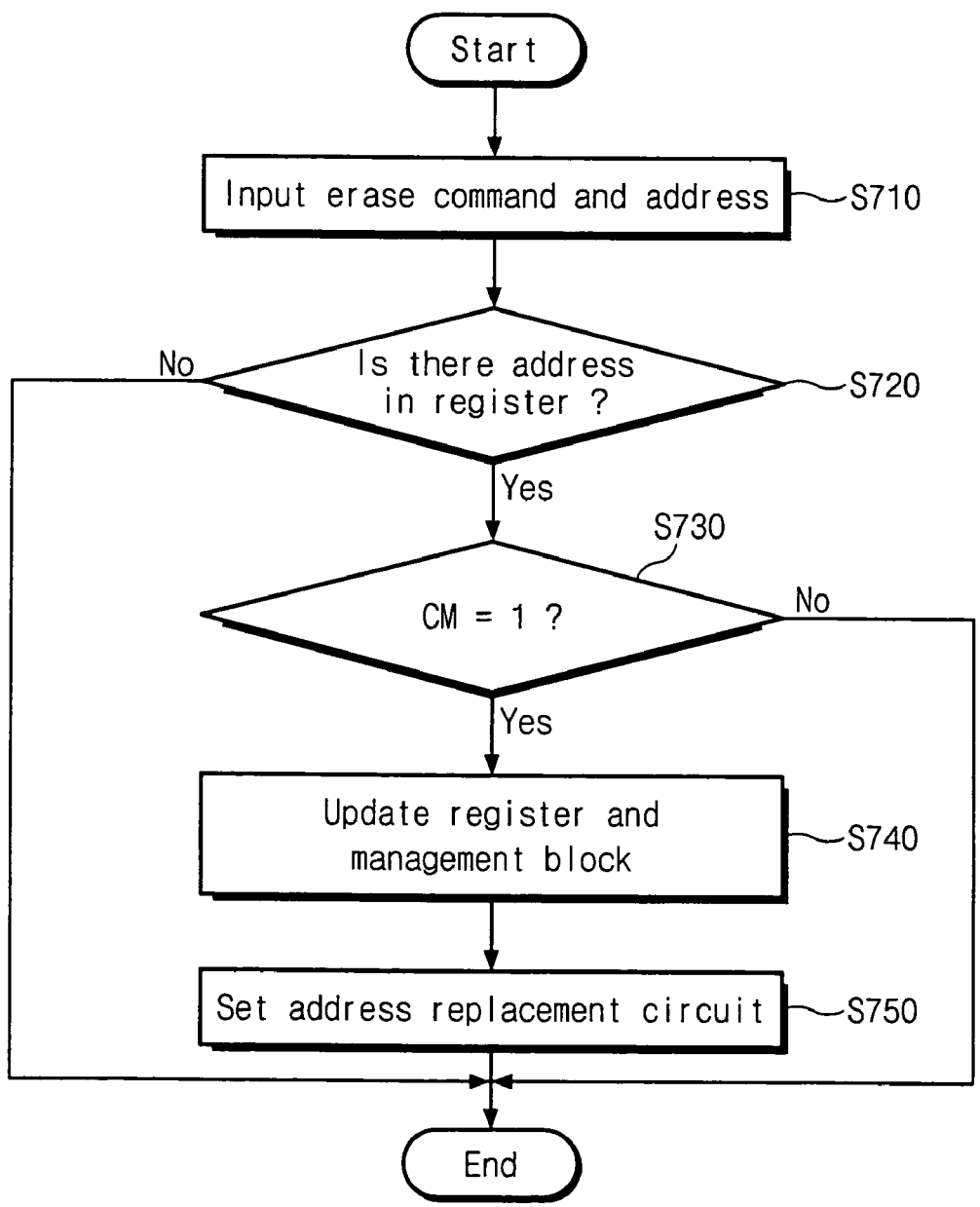
FIG. 7 is a flowchart illustrating operations of an erase operation for managing a bad block according to embodiments of the present invention.

FIG. 7 is a flowchart illustrating operations for managing a bad block in the event that an erase command is input. If an erase command and an address are input (at block S710), whether an address of a block to be erased exists in the register or not is determined. If an address of the block to be erased is not included in the register, a normal erase operation is performed. However, if an address of a block to be erased is included in the register, whether a CM region of a pertinent page is "1" or not is determined (at block S730). If the CM region of pertinent page is "1", data is updated to "0". If the data of the CM region is updated to "0", an address replacement circuit set may be to unconditionally access a reserved block without checking defective information with respect to the respective page included in a bad block even if an address with respect to the bad block is input (at block S750).

In flash memory systems according to embodiments of the present invention, a flash memory may use two bad blocks (a bad block and a reserved block) as a single block, so that a copy-back operation is unnecessary. In the event that a command instructing erasure of the bad block is input, the bad block may not be erased, and a displaced reserved block may be erased. From then on, the bad block is not used, and only the reserved block is used. Accordingly, as long as the bad block and the reserved block are used as one block, valid data may exist in two blocks.

Because flash memory systems according to embodiments of the present invention may include bad block management and may perform address replacement as discussed above, a time consuming copy-back operation may be unnecessary for a bad block. Operational speeds of flash memory systems according to embodiments of the present invention may thus be improved.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A memory system comprising:
a plurality of non-volatile memory cells arranged in blocks with each block including a plurality of pages of non-volatile memory cells, the plurality of non-volatile memory cells including a plurality of data blocks of non-volatile memory cells, a plurality of reserved blocks of non-volatile memory cells, and at least one management block of non-volatile memory cells; and
a memory controller coupled to the plurality of non-volatile memory cells, the memory controller being configured to receive a data address for a page of non-volatile memory cells of a data block during a memory access operation, to determine if the page of non-volatile memory cells corresponding to the data address is identified as being defective in the at least one management block, and to direct the memory access operation to a page of a reserved block of non-volatile memory cells if the page of non-volatile memory cells corresponding to the data address is identified as being defective in the at least one management block wherein the memory controller is further configured to copy information from the at least one management block of non-volatile memory cells to volatile memory and wherein determining if the page of non-volatile memory cells corresponding to the data address is identified as being defective in the at least one management block includes determining if the page of non-volatile memory cells corresponding to the data address is identified as being defective in the information copied to volatile memory.

2. A memory system according to claim 1 wherein the memory controller is further configured to direct the memory access operation to the page of non-volatile memory cells of the data block corresponding to the data address if the page of non-volatile memory cells corresponding to the data address is not identified as being defective in the at least one management block.

3. A memory system according to claim 1 wherein the memory controller is further configured to determine a reserve address identifying the page of the reserved block of non-volatile memory cells wherein directing the memory access operation to the page of the reserved block of non-volatile memory cells includes substituting the reserve address for the data address of the memory access operation.

4. A memory system according to claim 1 wherein after determining that the first page of non-volatile memory cells corresponding to the first data address is defective, the memory controller is further configured to receive a second data address for a second page of non-volatile memory cells of the data block during a second memory access operation, to determine if the second page of non-volatile memory cells corresponding to the second data address is identified as being defective in the at least one management block, and to direct the second memory access operation to the second page of the data block identified by the data address if the second page of non-volatile memory cells corresponding to the second data address is not identified as being defective in the at least one management block.

5. A memory system according to claim 1 wherein the memory access operation comprises at least one of a read and/or write operation.

6. A memory system according to claim 1 wherein the non-volatile memory cells comprise flash memory cells.

7. A memory system according to claim 1 wherein non-volatile memory cells of a page share a same word line.

8. A method of operating a memory system including a plurality of non-volatile memory cells arranged in blocks with each block including a plurality of pages of non-volatile memory cells, the plurality of non-volatile memory cells including a plurality of data blocks of non-volatile memory cells, a plurality of reserved blocks of non-volatile memory cells, and at least one management block of non-volatile memory cells, the method comprising:
  receiving a data address for a page of non-volatile memory cells of a data block during a memory access operation;
  determining if the page of non-volatile memory cells corresponding to the data address is identified as being defective in the at least one management block;
  directing the memory access operation to a page of a reserved block of non-volatile memory cells if the page of non-volatile memory cells corresponding to the data address is identified as being defective in the at least one management block; and
  copying information from the at least one management block of non-volatile memory cells to volatile memory, wherein determining if the page of non-volatile memory cells corresponding to the data address is identified as being defective in the at least one management block includes determining if the page of non-volatile memory cells corresponding to the data address is identified as being defective in the information copied to volatile memory.

9. A method according to claim 8 further comprising:
  directing the memory access operation to the page of non-volatile memory cells of the data block corresponding to the data address if the page of non-volatile memory cells corresponding to the data address is not identified as being defective in the at least one management block.

10. A method according to claim 8 further comprising:
  determining a reserve address identifying the page of the reserved block of non-volatile memory cells wherein directing the memory access operation to the page of the reserved block of non-volatile memory cells includes substituting the reserve address for the data address of the memory access operation.

11. A method according to claim 8 further comprising after determining that the that the first page of non-volatile memory cells corresponding to the first data address is defective:
  receiving a second data address for a second page of non-volatile memory cells of the data block during a second memory access operation;
  determining if the second page of non-volatile memory cells corresponding to the second data address is identified as being defective in the at least one management block; and
  directing the second memory access operation to the second page of the data block identified by the data address if the second page of non-volatile memory cells corresponding to the second data address is not identified as being defective in the at least one management block.

12. A method according to claim 8 wherein the memory access operation comprises at least one of a read and/or a write operation.

13. A method according to claim 8 wherein the non-volatile memory cells comprise flash memory cells.

14. A method according to claim 8 wherein non-volatile memory cells of a page share a same word line.

15. A memory system comprising:
  a plurality of non-volatile memory cells arranged in blocks with each block including a plurality of pages of non-volatile memory cells, the plurality of non-volatile memory cells including a plurality of data blocks of non-volatile memory cells, and a plurality of reserved blocks of non-volatile memory cells; and
  a memory controller coupled to the plurality of non-volatile memory cells, the memory controller being configured
  to receive a first data address for a first page of non-volatile memory cells of a data block during a first memory access operation,
  to determine if the first page of non-volatile memory cells of the data block corresponding to the first data address is defective,
  to direct the first memory access operation to a page of a reserved block of non-volatile memory cells if the first page of non-volatile memory cells of the data block corresponding to the first data address is defective,
  to receive a second data address for a second page of non-volatile memory cells of the data block during a second memory access operation after directing the first memory access operation,
  to determine if the second page of non-volatile memory cells of the data block corresponding to the second data address is defective after directing the first memory access operation, and
  to direct the second memory access operation to the second page of the data block corresponding to the second data address if the second page of non-volatile memory cells of the data block corresponding to the second data address is not defective after directing the first memory access operation,
  to erase all pages of the reserved block after directing the second memory access operation;
  to copy data of the second page of non-volatile memory cells of the data block to a respective page of the reserved block after erasing all pages of the reserved block; and
  to direct all subsequent memory access operations for the data block to the reserved block after copying.

16. A memory system according to claim 15 wherein the plurality of non-volatile memory cells further includes at least one management block of non-volatile memory cells wherein determining if the first page of non-volatile memory cells is defective includes determining if the first page of non-volatile memory cells corresponding to the first data address is identified as being defective in the at least one management block.

17. A memory system comprising:
   a plurality of non-volatile memory cells arranged in blocks with each block including a plurality of pages of non-volatile memory cells, the plurality of non-volatile memory cells including a plurality of data blocks of non-volatile memory cells, and a plurality of reserved blocks of non-volatile memory cells; and
   a memory controller coupled to the plurality of non-volatile memory cells, the memory controller being configured
   to receive a first data address for a first page of non-volatile memory cells of a data block during a first memory access operation,
   to determine if the first page of non-volatile memory cells of the data block corresponding to the first data address is defective,
   to direct the first memory access operation to a page of a reserved block of non-volatile memory cells if the first page of non-volatile memory cells of the data block corresponding to the first data address is defective,
   to receive a second data address for a second page of non-volatile memory cells of the data block during a second memory access operation after directing the first memory access operation,
   to determine if the second page of non-volatile memory cells of the data block corresponding to the second data address is defective after directing the first memory access operation, and
   to direct the second memory access operation to the second page of the data block corresponding to the second data address if the second page of non-volatile memory cells of the data block corresponding to the second data address is not defective after directing the first memory access operation;
   wherein the plurality of non-volatile memory cells further includes at least one management block of non-volatile memory cells wherein determining if the first page of non-volatile memory cells is defective includes determining if the first page of non-volatile memory cells corresponding to the first data address is identified as being defective in the at least one management block;
   wherein the memory controller is further configured to copy information from the at least one management block of non-volatile memory cells to volatile memory and wherein determining if the first page of non-volatile memory cells corresponding to the first data address is defective includes determining if the first page of non-volatile memory cells corresponding to the first data address is identified as being defective in the information copied to volatile memory.

18. A memory system according to claim 15 wherein the memory controller is further configured to direct the first memory access operation to the first page of non-volatile memory cells of the data block corresponding to the first data address if the first page of non-volatile memory cells corresponding to the first data address is not defective.

19. A memory system according to claim 15 wherein the memory controller is further configured to determine a reserve address identifying the page of the reserved block of non-volatile memory cells wherein directing the memory access operation to the page of the reserved block of non-volatile memory cells includes substituting the reserve address for the first data address of the first memory access operation.

20. A memory system according to claim 15 wherein the memory access operation comprises at least one of a read and/or write operation.

21. A memory system according to claim 15 wherein the non-volatile memory cells comprise flash memory cells.

22. A memory system according to claim 15 wherein non-volatile memory cells of a page share a same word line.

23. A method of operating a memory system including a plurality of non-volatile memory cells arranged in blocks with each block including a plurality of pages of non-volatile memory cells, the plurality of non-volatile memory cells including a plurality of data blocks of non-volatile memory cells and a plurality of reserved blocks of non-volatile memory cells, the method comprising:
   receiving a first data address for a first page of non-volatile memory cells of a data block during a first memory access operation;
   determining if the first page of non-volatile memory cells of the data block corresponding to the first data address is defective;
   directing the first memory access operation to a page of a reserved block of non-volatile memory cells if the first page of non-volatile memory cells of the data block corresponding to the first data address is defective;
   after directing the first memory access operation, receiving a second data address for a second page of non-volatile memory cells of the data block during a second memory access operation;
   after directing the first memory access operation, determining if the second page of non-volatile memory cells of the data block corresponding to the second data address is defective; and
   after directing the first memory access operation, directing the second memory access operation to the second page of the data block corresponding to the second data address if the second page of non-volatile memory cells corresponding to the second data address is not defective
   wherein the plurality of non-volatile memory cells further includes at least one management block of non-volatile memory cells wherein determining if the first page of non-volatile memory cells is defective includes determining if the first page of non-volatile memory cells corresponding to the first data address is identified as being defective in the at least one management block;
   copying information from the at least one management block of non-volatile memory cells to volatile memory, wherein determining if the first page of non-volatile memory cells corresponding to the first data address is defective includes determining if the first page of non-volatile memory cells corresponding to the first data address is identified as being defective in the information copied to volatile memory.

24. A method according to claim 23 further comprising:
   directing the first memory access operation to the first page of non-volatile memory cells of the data block corresponding to the first data address if the first page of non-volatile memory cells corresponding to the first data address is not defective.

25. A method according to claim 23 further comprising:
   determining a reserve address identifying the page of the reserved block of non-volatile memory cells wherein directing the memory access operation to the page of the reserved block of non-volatile memory cells includes substituting the reserve address for the first data address of the first memory access operation.

26. A method according to claim 23 wherein the memory access operation comprises at least one of a read and/or write operation.

27. A method according to claim 23 wherein the non-volatile memory cells comprise flash memory cells.

28. A method according to claim 23 wherein non-volatile memory cells of a page share a same word line.

29. A method according to claim 23 further comprising:
after directing the second memory access operation, erasing all pages of the reserved block;
after erasing all pages of the reserved block, copying data of the second page of non-volatile memory cells of the data block to a respective page of the reserved block; and
after copying, directing all subsequent memory access operations for the data block to the reserved block.

* * * * *